(12) United States Patent
Roh et al.

(10) Patent No.: US 6,590,512 B2
(45) Date of Patent: Jul. 8, 2003

(54) DEVELOPING A DESIRED OUTPUT SAMPLING RATE FOR OVERSAMPLED CONVERTERS

(75) Inventors: Jeongjin Roh, Austin, TX (US); Vijayakumaran V. Nair, Austin, TX (US); Jiang Chen, Austin, TX (US); Rose W. Wang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/840,673

(22) Filed: Apr. 23, 2001

(65) Prior Publication Data

US 2002/0154047 A1 Oct. 24, 2002

(51) Int. Cl.[7] ................................................. H03M 3/00
(52) U.S. Cl. ........................ 341/143; 341/61; 341/144; 341/155
(58) Field of Search ........................... 341/61, 155, 144, 341/143

(56) References Cited

U.S. PATENT DOCUMENTS

| | | | | |
|---|---|---|---|---|
| 5,245,345 A | * | 9/1993 | Kohdaka et al. | 341/152 |
| 5,287,296 A | * | 2/1994 | Bays et al. | 377/47 |
| 5,907,295 A | * | 5/1999 | Lin | 341/61 |
| 6,127,958 A | * | 10/2000 | Chang et al. | 341/155 |
| 6,140,950 A | * | 10/2000 | Oprescu | 341/143 |
| 6,169,506 B1 | * | 1/2001 | Oprescu et al. | 341/143 |
| 6,362,755 B1 | * | 3/2002 | Tinker | 341/155 |

* cited by examiner

*Primary Examiner*—Michael Tokar
*Assistant Examiner*—Linh V Nguyen
(74) *Attorney, Agent, or Firm*—Trop, Pruner & Hu, P.C.

(57) ABSTRACT

An analog to digital converter may achieve an output sampling rate that is not an integer multiple of the system clock. This may be done without using the conventional phase-locked loop circuit that generally requires a longer design time, more testing, and more silicon area. A pseudo clock may be generated from the system clock in which some of the system clock pulses are disabled to achieve a pseudo clock with the desired effective frequency.

21 Claims, 4 Drawing Sheets

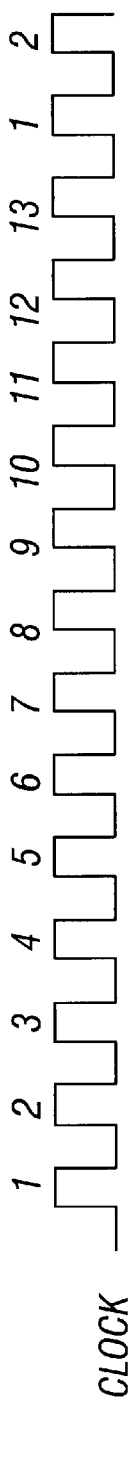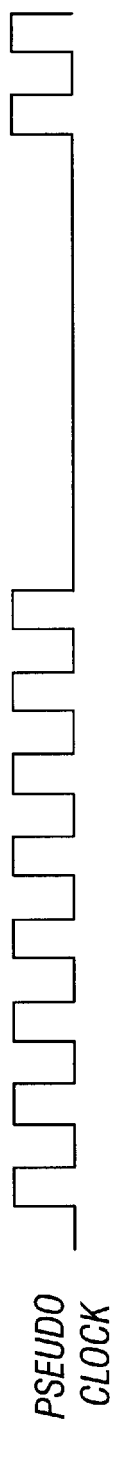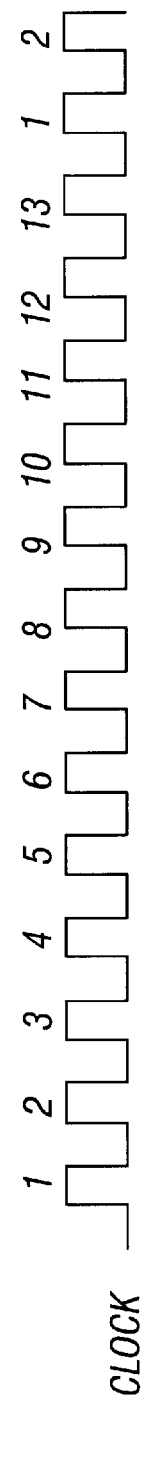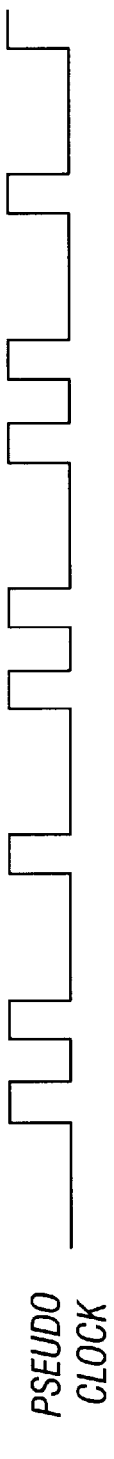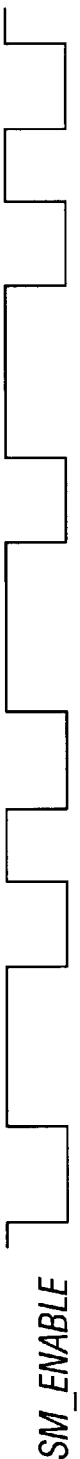
FIG. 2A  CLOCK
FIG. 2B  PSEUDO CLOCK
FIG. 2C  DSM_ENABLE
FIG. 3A  CLOCK
FIG. 3B  PSEUDO CLOCK
FIG. 3C  DSM_ENABLE

DEVELOPING A DESIRED OUTPUT SAMPLING RATE FOR OVERSAMPLED CONVERTERS

BACKGROUND

This invention relates generally to oversampled analog to digital converters that convert an analog input to a digital output suitable for use by a variety of digital circuits including processors.

An analog to digital converter may be an important circuit because it interfaces the real world with digital logic. For example, the human voice is inherently an analog signal that may be converted to a digital signal before it may be processed by a digital signal processor or a microprocessor. However, the performance of many analog to digital converter architectures is significantly affected by process variations, such as the resistance or capacitance variations inherent in weighting networks used with successive approximation or dual ramp conversion techniques.

Analog to digital converters may be based on oversampling techniques for higher resolution. The analog to digital converter using oversampling may operate at a clock rate that is higher than the data rate of the oversampled analog signal. Oversampling analog to digital converters may use delta-sigma modulators, to noise shape a bit stream and to develop a pulse density proportional to the analog signal's amplitude.

The delta-sigma architecture is robust for process variations using oversampling and decimation. Therefore, the delta-sigma architecture may not need high precision resistor or capacitor weighting networks. As a result, delta-sigma analog to digital converters are the prevailing technique for use in voice, audio and instrumentation applications.

The delta-sigma modulator receives an analog input and a high speed sampling clock. Its output is filtered to eliminate modulation noise. Also, because the output of the delta-sigma modulator has a high sampling rate, it is normally decimated to generate the final digital output at the desired frequency. The ratio between the delta-sigma modulator sampling rate and the output frequency is called the oversampling ratio.

For a variety of electronic applications, there are international standards for the signal band and output sampling rate. As one example, one international standard for voice coding for communication currently requires an output sampling rate of eight kilohertz. In order to have an eight kilohertz output sampling rate, the oversampling ratio should be an integer multiplication of eight kilohertz.

A problem arises when the system clock is not an integer multiplication of the desired output signal frequency. Suppose in a voice coder/decoder, or codec, the system clock is thirteen megahertz and the output sampling rate must be eight kilohertz pursuant to a standard. The decimation ratio is thirteen megahertz divided by thirty-two kilohertz (which is the output of a sinc filter) or 406.25. Since the design of digital logic to achieve a decimation ratio 406.25, is not viable, it would be desirable to achieve a sampling rate that is a multiple of eight kilohertz in this example.

The conventional solution to this dilemma is to design a phase-locked loop (PLL) and to generate the needed sampling clock to the delta-sigma modulator. For example, a phase-locked loop with an eight megahertz clock rate will enable the delta-sigma modulator to output a data rate of eight megahertz. This output may be filtered to thirty-two kilohertz and then decimated to eight kilohertz, as one example.

The use of a phase-locked loop may increase design time, take up silicon area and require more testing. Thus, there is a need for a technique to achieve a desired output sampling rate when the system clock is not an integer multiplication of the desired output sampling rate without using a phase-locked loop.

BRIEF DESCRIPTION OF THE DRAWINGS

FIGS. 2a, 2b and 2c show various signals that may be utilized in accordance with one embodiment of the FIG. 1;

FIGS. 3a, 3b and 3c show various clock signals that maybe utilized in accordance with another embodiment of the present invention;

DETAILED DESCRIPTION

Figure 1:
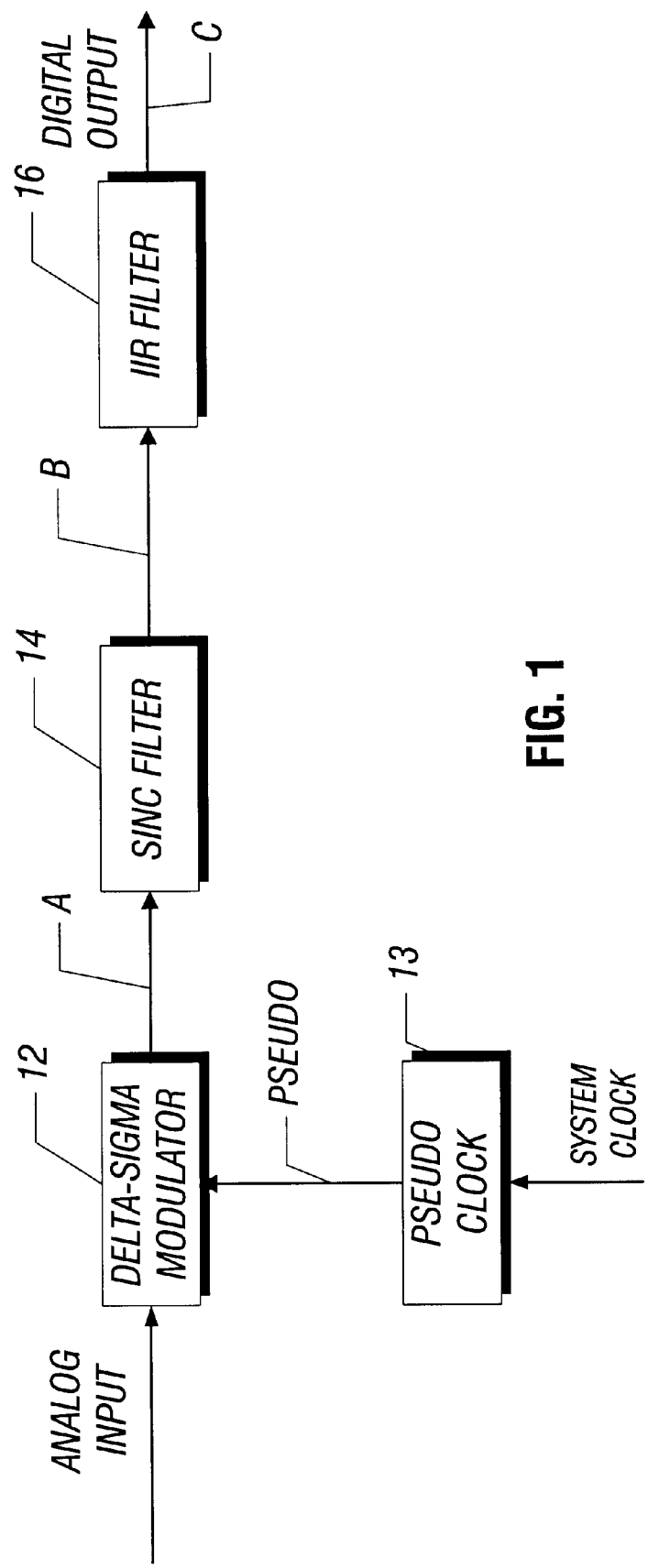
FIG. 1 is a block diagram of a delta-sigma converter in accordance with one embodiment of the present invention.

Referring to FIG. 1, a delta-sigma modulator 12 receives an analog input as indicated. The modulator 12 also receives a clock signal from the pseudo clock signal generator 13. The delta-sigma modulator 12 produces an output signal A that is decimated, for example by sinc filter 14, to produce an output signal B. The output signal B may then be filtered, for example, by an infinite impulse response(IIR) filter 16 to produce an output signal C.

For explanation purposes, an example involving a voice codec may be described. In such an example, the delta-sigma modulator 12 may receive an analog input and a clock signal corresponding to a system clock rate of thirteen megahertz. The delta-sigma modulator 12 may output a signal A at a data rate of eight megahertz. The filter 14 may produce a filtered output B at thirty-two kilohertz. The filter 16 may produce a digital output C of the desired eight kilohertz in accordance with an international standard, in one embodiment. Of course, this example is not intended to be limiting in any way on the present invention. In this example, the eight megahertz sampling rate for the delta-sigma modulator 12 may be selected to meet an international standard with sufficient margin and reasonable power consumption.

Thus, the clock signal to the delta-sigma modulator is indicated in FIG. 2a. In the illustrated example, the clock signal shown in FIG. 2a may be a thirteen megahertz clock signal. However as explained above, the use of a thirteen megahertz clock signal would be ineffective to achieve a reasonably viable decimation ratio. Instead, a pseudo clock signal shown in FIG. 2b may be provided to the delta-sigma modulator 12. In the example shown in FIG. 2b, for every thirteen clocks, only the first eight clock pulses toggle while the other five pulses are disabled. Of course different pseudo clock signals can be used, as shown for example in FIG. 3b. The idea in both FIGS. 2b and 3b is to disable some of the clock pulses to generate a pseudo clock of a lower effective clock rate without the need for a phase-locked loop.

An enable signal shown in FIGS. 2c and 3c indicates the real sampling timing. The sampling rate is eight samples divided by thirteen samples times thirteen megahertz or eight megahertz in this illustration. Thus by using an enable signal, as shown in FIGS. 2c and 3c, a clock signal having the desired sampling rate may be achieved without actually changing the system clock.

Figure 4:
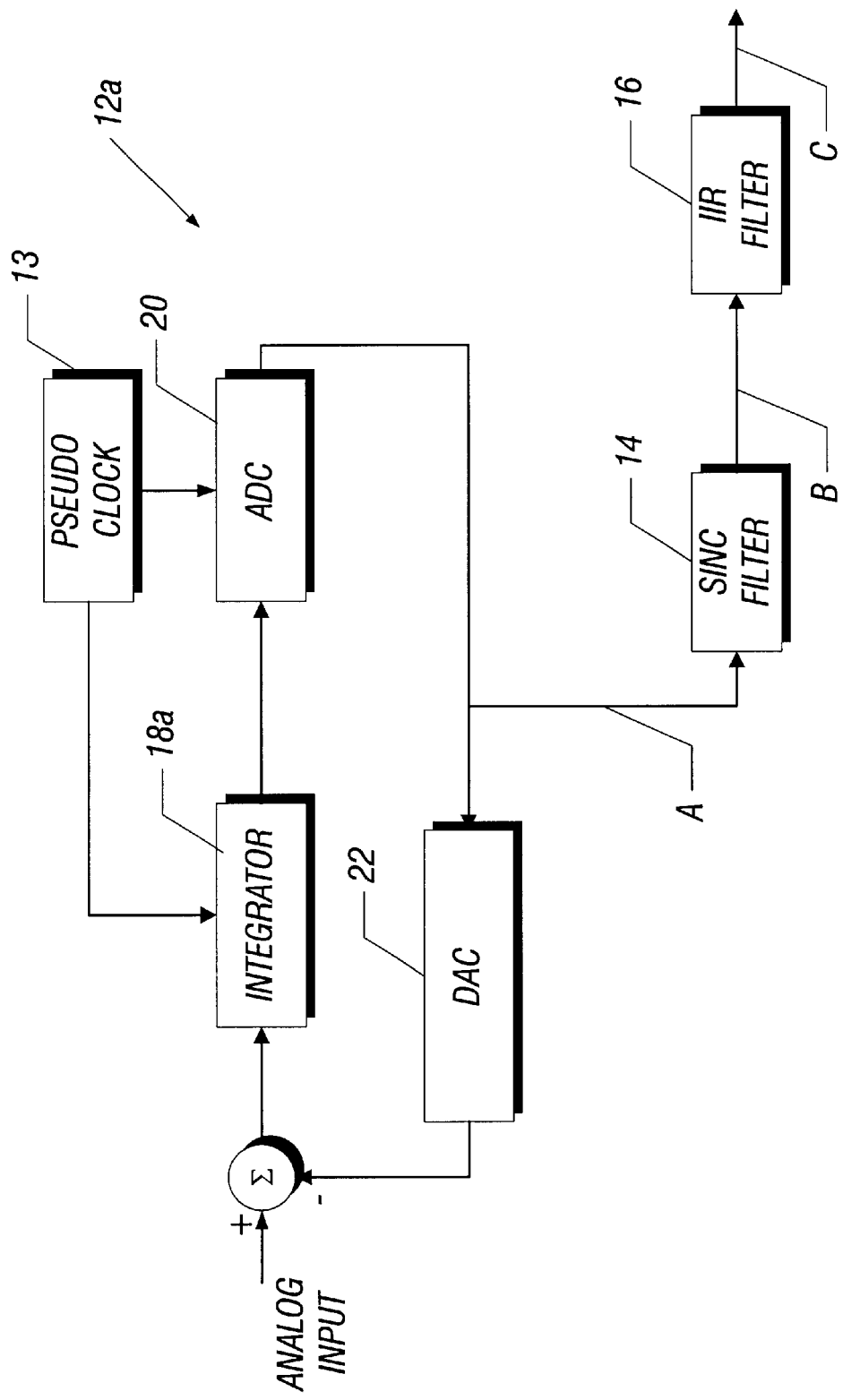
FIG. 4 is a block diagram of a delta-sigma modulator in accordance with one embodiment of the present invention.

Referring to FIG. 4, a delta-sigma modulator 12a may be implemented using switched capacitor or switched current circuits. Thus, the integrator 18a may be a switched capacitor integrator that feeds an output signal to the analog to digital converter (ADC) 20. The ADC 20 receives the pseudo clock as described previously. A feedback loop through a digital to analog converter 22 is also included. The output of the ADC 20 may also be decimated and filtered as described previously. The pseudo clock signal (described before) may be utilized to control the switches for the integrator 18a. Single and multiple bit switched capacitor designs may be included in various embodiments.

Figure 5:
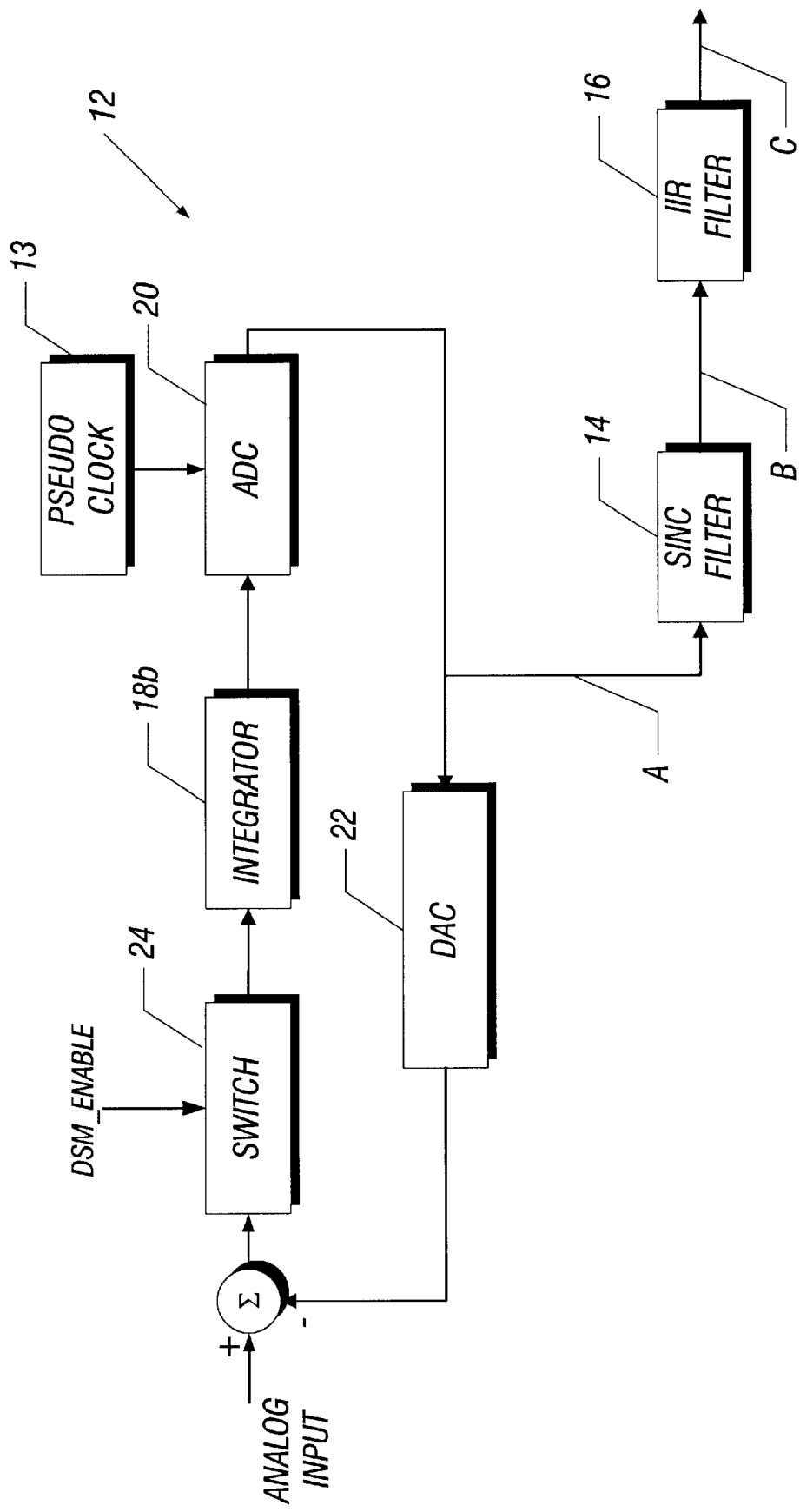
FIG. 5 is a block diagram of a delta-sigma modulator in accordance with another embodiment of the present invention.

Referring to FIG. 5, a continuous-time delta-signal modulator 12b includes the ADC 20. In one example, the system clock frequency may be at a rate that would not achieve a viable decimation ratio given the needed output sampling rate. The ADC 20 may receive a pseudo clock for delta-sigma modulation. A delta-sigma enable signal to a switch 24 and the pseudo clock may be the main control signals for the delta-signal modulator 12b sampling in one embodiment.

The switch 24 receives the enable signal described previously. The switch 24 controls the operation of the integrator 18b. Without the switch 24, in some embodiments, the integrator 18b may generate an inaccurate result because it may integrate during the periods when the pseudo clock is disabled. The integrator 18b integrates all of the input signals, subject to the action of the switch 24. The switch 24 stops the integrator 18b from integrating during the inactive pulse periods.

Design time and silicon area may be saved relative to a phase-locked loop based circuit. Thus, a desired sampling rate may be derived from a system clock that is not an integer multiple of the desired output sampling rate. For example, the eight megahertz sample may be generated from a thirteen megahertz system clock with a required decimation ratio for the sinc filter 14 of 250. In other words, the sinc filter decimation ratio is eight megahertz divided by thirty-two kilohertz or 250.

The pseudo clock may be generated for the delta-sigma modulator 12 by disabling five of every thirteen clocks from the thirteen megahertz system clock in one example. Then the sampling rate is eight megahertz instead of thirteen megahertz. The analog integrator 18 may be stopped by the switch 24 controlled by the enable signal.

The analog to digital converter 20, shown in FIGS. 4 and 5, may be implemented as a comparator or one bit analog to digital converter. This one bit analog to digital converter implementation may be desirable because of its simplicity. Multi-bit analog to digital converters, such as four or five bit analog to digital converters may be used to further increase signal to noise ratios in various embodiments.

By eliminating the phase-locked loop circuit, the design time for the analog to digital circuit may be reduced. In addition, because the phase-locked loop uses significant silicon area, the area needed for the analog to digital converter may also be reduced. Also, the testing time for the final integrated circuit may be reduced composed to that of phase-locked loops. Thus, an asynchronous sampling frequency may be converted to a final output sampling frequency without having a phase-locked loop circuit on chip.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A circuit comprising:

a clock signal generator to generate from a system clock that is not an integer multiple of an output sampling rate of a converter, a clock signal having some pulses that toggle and other pulses that are disabled, wherein the clock signal generator to dynamically control sampling of an analog input signal based on a ratio of the system clock and the output sampling rate of the converter; and a delta-sigma modulator coupled to receive the clock signal to sample the analog input signal at a rate that is the integer multiple of the output sampling rate of the converter.

2. The circuit of claim 1 wherein said circuit includes a continuous-time analog to digital converter.

3. The circuit of claim 1 wherein said circuit includes a switched capacitor converter.

4. The circuit of claim 1 wherein said circuit is a switched current converter.

5. The circuit of claim 4 that achieves the output sampling rate without using a phase-locked circuit.

6. The circuit of claim 1 including an integrator, said integrator coupled to said delta-sigma modulator.

7. The circuit of claim 6 including a switch coupled to said integrator to control an analog input signal to said integrator.

8. The circuit of claim 7 wherein said switch passes an analog signal to the integrator for a period corresponding to a period when said clock generator pulses are toggling.

9. The circuit of claim 1 wherein the delta-sigma modulator is coupled to a decimator.

10. The circuit of claim 9 wherein said delta-sigma modulator is coupled to a filter.

11. A converter comprising:

a device to convert a system clock that is not an integer multiple of a converter output sampling rate to sample an analog input signal at a sampling rate that is an integer multiple of the converter output sampling rate, wherein said converter to achieve the output sampling rate without using a phase-locked loop; and a delta-sigma modulator coupled to said device, wherein said device dynamically controls sampling of the analog input signal by said delta-sigma modulator based on a ratio of the system clock and the converter output sampling rate.

12. The converter of claim 11 wherein said converter includes a continuous-time analog to digital converter.

13. The converter of claim 11 wherein said converter includes a switched capacitor converter.

14. The converter of claim 11 wherein said converter includes a switched current converter.

15. The converter of claim 11 wherein said device includes a clock signal generator to generate a clock signal having some pulses that toggle and other pulses that are disabled.

16. The converter of claim 11 including an integrator, said integrator coupled to said delta-sigma modulator.

17. The converter of claim 16 including a switch coupled to said integrator to control an analog input signal to said integrator.

18. The converter of claim 17 wherein said switch passes an analog signal to the integrator for a period corresponding to a period when said clock generator pulses are toggling.

19. A method comprising:

receiving an analog signal;

converting a system clock that is not an integer multiple of an output sampling rate of a converter to a pseudo clock by disabling some of the system clock pulses;

using said pseudo clock as a clock for a delta-sigma modulator;

sampling said analog signal at a rate that is the integer multiple of the output sampling rate of the converter based on said clock; and dynamically controlling sampling of said analog signal based on a ratio of the system clock and the output sampling rate of the converter.

20. The method of claim 19 including decimating and filtering the output from said delta-sigma modulator.

21. The method of claim 19 including coupling said analog signal to an integrator and controlling the analog signal to deactivate said integrator when said pseudo clock pulses are deactivated.

* * * * *